(12) United States Patent
Fayed

(10) Patent No.: US 6,724,258 B1
(45) Date of Patent: Apr. 20, 2004

(54) HIGHLY-LINEAR, WIDE-INPUT-RANGE, WIDE CONTROL-RANGE, LOW-VOLTAGE DIFFERENTIAL VOLTAGE CONTROLLED TRANSCONDUCTOR

(75) Inventor: Ayman A. Fayed, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/309,556

(22) Filed: Dec. 4, 2002

(51) Int. Cl.[7] ................................................. H03F 3/45
(52) U.S. Cl. ...................................... 330/260; 330/253
(58) Field of Search ............................... 330/253, 257, 330/260, 261; 327/359

(56) References Cited

U.S. PATENT DOCUMENTS

| | | | |
|---|---|---|---|
| 5,442,318 A | * | 8/1995 | Badyal et al. ............... 330/253 |
| 6,177,838 B1 | * | 1/2001 | Chiu .......................... 330/253 |
| 6,549,074 B2 | * | 4/2003 | Ugajin et al. ............... 330/258 |
| 6,590,452 B1 | * | 7/2003 | van Rhijn .................... 330/260 |

\* cited by examiner

Primary Examiner—Khanh Van Nguyen

(74) Attorney, Agent, or Firm—J. Dennis Moore; W. James Brady, III; Frederick J. Telecky, Jr.

(57) ABSTRACT

A voltage controlled transconductor (VCT) for receiving a differential input signal comprising a first voltage signal and a second voltage signal, and for providing a differential output signal comprising a first output current signal and a second output current signal. The VCT includes a first side transconductor circuit having two parts of the same construction, the first part being capable of conducting a first current signal and the second part being capable of conducting a second current signal, the first current signal and the second current signal being controlled by the first voltage signal. The VCT also includes a second side transconductor circuit having two parts of the same construction, the first part being capable of conducting a third current signal and the second part being capable of conducting a fourth current signal, the third current signal and the fourth current signal being controlled by the second voltage signal. A first control circuit is adapted to control the first and second current signals of the first side transconductor circuit, while a second control circuit is adapted to control the third and fourth current signals of the second side transconductor circuit. The first side transconductor circuit is connected to the second side transconductor circuit to provide the first output current signal comprising a difference of the second current signal and the third current signal and to provide the second output current signal comprising a difference of the first current signal and the fourth current signal.

4 Claims, 1 Drawing Sheet

HIGHLY-LINEAR, WIDE-INPUT-RANGE, WIDE CONTROL-RANGE, LOW-VOLTAGE DIFFERENTIAL VOLTAGE CONTROLLED TRANSCONDUCTOR

TECHNICAL FIELD OF THE INVENTION

This invention relates to fully differential voltage controlled transconductors, and more particularly relates to such transconductors that operate at low voltage with highly linear performance and wide input and control ranges.

BACKGROUND OF THE INVENTION

Voltage controlled transconductors are used in a wide range of applications, for example in active filters circuits-such as Gm-C filters-multipliers and oscillators. Detailed descriptions of their construction and principles of operation are readily available. For example, see Analog Integrated Circuit Design, by David A. Johns and Ken Martin, John Wiley & Sons, New York© 1997, pages 605–607. FIG. 1 shows a representative prior art voltage controlled transconductor (VCT) circuit that is based on the linear mode of operation of MOSFETs. As is known, linear mode based transconductors provide better performance than saturation mode transconductors. The circuit comprises transistors M1 through M9 and operational amplifiers 101, 102 and 103, interconnected as shown. The circuit provides differential output currents Io+ and Io− in response to a differential input voltage Vid which is superimposed on a constant common-mode voltage signal Vcm. The drain-to-source voltages (Vds) of input transistors M1 and M2 are held to a control voltage Vc to control the current flowing into transistors M1 and M2, thereby controlling the transconductance of the entire circuit.

In applications where high precision is required, a VCT circuit like that of FIG. 1 can provide less than adequate performance in certain key areas. For example, such a circuit may not be truly fully differential. In other words, the absolute values of gm+ and gm− may not be exactly the same. In addition, such a circuit suffers from nonlinearities in currents Io+ and Io−. That is, the values of gm+ and gm− are functions of Vid, instead of being constants. These nonlinearities and that the circuit is not truly differential can be understood because the theoretical circuit operation is based on the ideal behavior of MOSFET transistors in the linear mode, which does not take into account the second order effects and the non-idealities.

Another problem is that the range of the control voltage Vc may be insufficient to provide an adequately robust and controlled performance. This is because in the circuit of FIG. 1 if a wide input range is needed then the control voltage range must decrease in order to keep transistors M1 and M2 in the linear mode of operation, and vice versa, which is a disadvantage at low supply voltages.

Finally, the VCT circuit of FIG. 1 requires a third operational amplifier 103, for the common mode input Vcm. The common mode itself must be extracted from the input signal, which needs an extra circuit, as well.

It is therefore desirable to have a VCT circuit that overcomes some or all of the above-described problems.

SUMMARY OF THE INVENTION

In accordance with the present invention there is provided a voltage controlled transconductor (VCT) for receiving a differential input signal comprising a first voltage signal and a second voltage signal, and for providing a differential output signal comprising a first output current signal and a second output current signal. The VCT includes a first side transconductor circuit having two parts of the same construction, the first part being capable of conducting a first current signal and the second part being capable of conducting a second current signal, the first current signal and the second current signal being controlled by the first voltage signal. The VCT also includes a second side transconductor circuit having two parts of the same construction, the first part being capable of conducting a third current signal and the second part being capable of conducting a fourth current signal, the third current signal and the fourth current signal being controlled by the second voltage signal. A first control circuit is adapted to control the first and second current signals of the first side transconductor circuit, while a second control circuit is adapted to control the third and fourth current signals of the second side transconductor circuit. The first side transconductor circuit is connected to the second side transconductor circuit to provide the first output current signal comprising a difference of the second current signal and the third current signal and to provide the second output current signal comprising a difference of the first current signal and the fourth current signal.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 1:
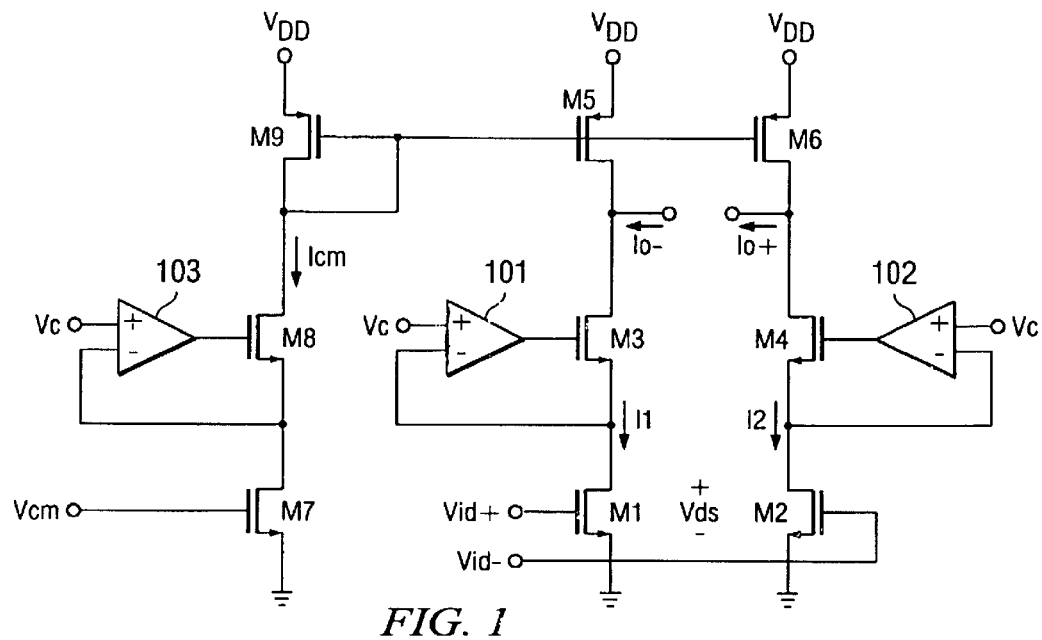
FIG. 1 is a circuit diagram of a representative prior art voltage controlled transconductor (VCT) circuit.

To better understand the embodiments of the present invention described herein, it is useful to understand the circuit of FIG. 1 in more detail. In the circuit of FIG. 1, assuming linear mode of operation, $$I1 = K\left[\left(Vcm + \frac{Vid}{2} - Vt\right)Vc - \frac{Vc^2}{2}\right] \quad \text{Eq. (1)}$$

$$I2 = K\left[\left(Vcm - \frac{Vid}{2} - Vt\right)Vc - \frac{Vc^2}{2}\right] \quad \text{Eq. (2)}$$

$$Icm = K\left[(Vcm - Vt)Vc - \frac{Vc^2}{2}\right] \quad \text{Eq. (3)}$$

$$Io+ = Icm - I2 = \frac{K}{2}VidVc \quad \text{Eq. (4)}$$

$$Io- = KI - Icm = \frac{K}{2} VidVc \qquad \text{Eq. (5)}$$

$$gm+ = gm- = \frac{K}{2} Vc \qquad \text{Eq. (6)}$$

where Vid is the differential input voltage, Vcm is the common mode voltage of the input, Vc is the control voltage, gm+ is the positive side output transconductance, gm− is the negative side output transconductance, Vt is the threshold voltage of the NMOS transistors M1, M2 and M7, K is the transconductance factor $\mu_n C_{ox}$(W/L) for transistors M1, M2 and M7 in their triode region, I1 is the current through transistor M1, I2 is the current through transistor M2, Icm is the current through transistor M7, Io+ is the positive side output current and Io− is the negative side output current. In the transconductance factor, W is the width and L is the length of the channel, $\mu_n$ is the average electron mobility in the channel, and $C_{ox}$ is the gate oxide capacitance per unit area, for the transistor.

Now, it was mentioned above that certain problems exist with this circuit. That is, the absolute values of gm+ and gm− may not be exactly the same. In addition, the range of the control voltage Vc may be insufficient to provide an adequately robust and controlled performance. Further, the VCT circuit of FIG. 1 requires a third operational amplifier 103, for the common mode input Vcm. And finally, the linearity of the output currents Io+ and Io− may be inadequate.

Regarding the problem of the limitation of the range of the control voltage, note that Equations (1) through (6) assume the ideal linear mode of operation for transistors M1, M2 and M7. However, for this to be the case, the condition $$Vc < Vcm - \frac{Vid}{2} - Vt \qquad \text{Eq. (7)}$$

must be met. However, this implies that if a wide input range is needed then the control range must decrease, and vice versa, which is a disadvantage at low supply voltages.

Regarding the problem that the linearity of the output currents Io+ and Io− may be inadequate, in order to understand this, second order effects must be considered. Equations (1) through (7) assume that in the linear mode of operation the current is linearly proportional to the gate-to-source voltage (Vgs), i.e., perform according to the ideal MOSFET current formula. However, that is not very accurate, especially for short channel transistors. In order to model the nonlinearity with respect to the Vgs for a MOSFET, the current equation for the linear mode of operation could be written:

$$Id = K\left[((Vgs + \alpha Vgs^2 + \alpha_1 Vgs^3 + \dots) - Vt)Vds - \frac{Vds^2}{2}\right] \qquad \text{Eq. (8)}$$

where Id is the drain current, Vgs is the gate-to-source voltage, Vds is the drain-to-source voltage and α is a process dependent parameter. Other symbols are as defined above. Since the cubic and higher order terms are very small, they can be discarded for the purpose of this analysis. Equation (8) then becomes:

$$Id = K\left[((Vgs + \alpha Vgs^2) - Vt)Vds - \frac{Vds^2}{2}\right] \qquad \text{Eq. (9)}$$

Using the formulation set forth in Equation (9), Equations (1) through (6) can be expressed as follows:

$$I1 = K\left[\left(\left(Vcm + \frac{Vid}{2}\right) + \alpha\left(Vcm + \frac{Vid}{2}\right)^2 - Vt\right)Vc - \frac{Vc^2}{2}\right] \qquad \text{Eq. (10)}$$

$$I2 = K\left[\left(\left(Vcm - \frac{Vid}{2}\right) + \alpha\left(Vcm - \frac{Vid}{2}\right)^2 - Vt\right)Vc - \frac{Vc^2}{2}\right] \qquad \text{Eq. (11)}$$

$$Icm = K\left[((Vcm) + \alpha(Vcm)^2 - Vt)Vc - \frac{Vc^2}{2}\right] \qquad \text{Eq. (12)}$$

$$Io+ = Icm - I2 = K\left[\left(\frac{Vid}{2} + \alpha\left(2Vcm - \frac{Vid}{2}\right)\frac{Vid}{2}\right)Vc\right] \qquad \text{Eq. (13)}$$

$$Io- = KI - Icm = K\left[\left(\frac{Vid}{2} + \alpha\left(2Vcm + \frac{Vid}{2}\right)\frac{Vid}{2}\right)Vc\right] \qquad \text{Eq. (14)}$$

$$gm+ = \frac{\partial}{\partial Vid} Io+ = K\left[\frac{1}{2} + 2\alpha Vcm - \frac{\alpha}{4} Vid\right]Vc \qquad \text{Eq. (15)}$$

$$gm- = \frac{\partial}{\partial Vid} Io- = K\left[\frac{1}{2} + 2\alpha Vcm + \frac{\alpha}{4} Vid\right]Vc \qquad \text{Eq. (16)}$$

Equations (15) and (16) aid in understanding all of the problems mentioned above in connection with the circuit of FIG. 1. First, the values of both gm+ and gm− are dependent on the value of Vid, which introduces nonlinearity to the output. This nonlinearity increases the total harmonic distortion in the output. If a specific linearity performance is required, then the input range must be limited to a small value.

Second, note that gm+ and gm− are not equal, and neither are the absolute values of Io+ and Io−. This means that the circuit is not truly fully differential. This introduces common mode distortion in the output.

Third, regarding the problem of the control voltage range, Equations (15) and (16) assume that both transistors M1 and M2 are in the linear mode of operation, the condition for which is set forth in Equation (7). Therefore, with high magnitude differential input signals, the linear control voltage range is limited to the value set forth in Equation (7), as described above. In many applications, the linearity of the transconductance with respect to the control voltage is not very important, but, instead, the range of control the control voltage has over the transconductance is more important. In order to aid in understanding how the transconductance is affected when the control voltage is higher than the value set forth in Equation (7), consider such a case in which there is a positive differential voltage. In that case, transistor M1 will continue to be in the linear mode of operation, while transistor M2 will enter the saturation mode of operation. The current equation for transistor M2 is set forth in the following equation:

$$I2 = \frac{K}{2}\left(VCM - \frac{Vid}{2} - Vt\right)^2 \qquad \text{Eq. (17)}$$

Thus:

$$gm+ = \frac{\partial}{\partial Vid} Io += K\left(Vcm - \frac{Vid}{2} - Vt\right) \text{ and} \qquad \text{Eq. (18)}$$

$$gm- = \frac{\partial}{\partial Vid} Io -= K\left(\frac{1}{2} + 2\alpha Vcm + \frac{\alpha Vid}{4} - Vt\right) Vc \qquad \text{Eq. (19)}$$

As Equations (18) and (19) show, the transconductance of the positive output is saturated and does not depend on Vc, which means that it cannot be controlled any further, while the transconductance of the negative output, although it is dependent on Vid, but it can still be controlled with Vc. This means that in order for the two outputs to be fully differential, the control voltage range must always be limited to the value stated in Equation (18). Otherwise, one current output will be changing with Vc, while the other output will, be constant, which is a very undesirable performance.

Fourth, as mentioned above, a third operational amplifier 103 must be used to generate the ICM current, and extra circuitry must be used to extract the common mode voltage, which increases the size and power consumption of the transconductor circuit.

Figure 2:
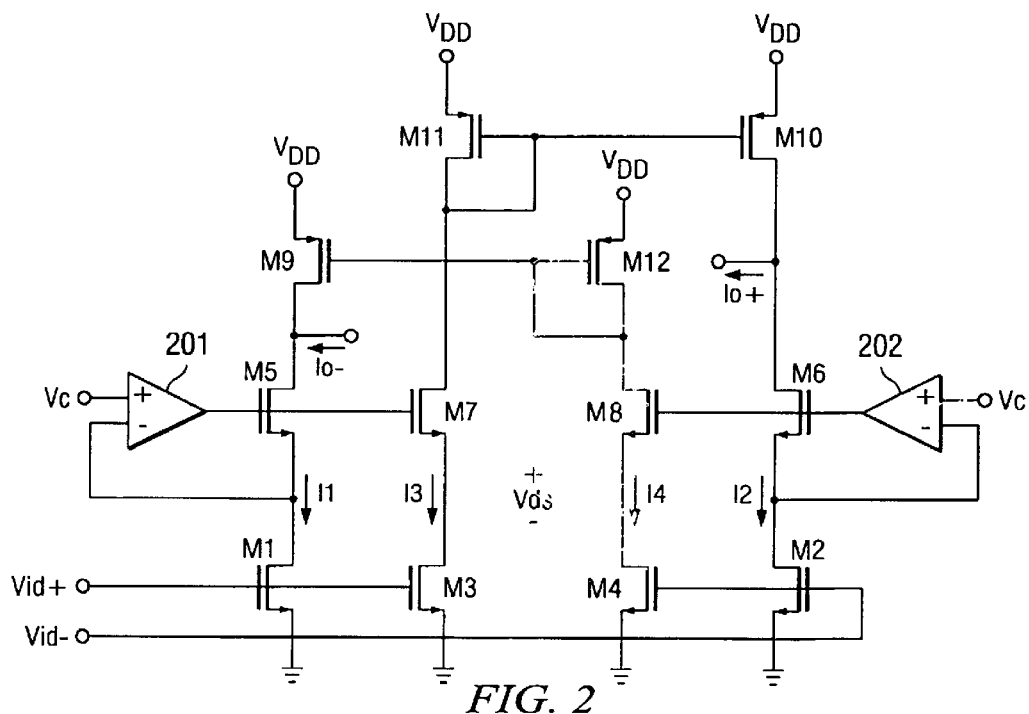
FIG. 2 is a circuit diagram of a VCT circuit in accordance with a preferred embodiment of the present invention.

FIG. 2 is a circuit diagram of an embodiment of a VCT circuit in accordance with a preferred embodiment of the present invention. In this circuit, NMOS transistors M1 and M5 and PMOS transistor M9 are connected in series between the supply voltage $V_{DD}$ and ground, NMOS transistors M3 and M7 and PMOS transistor M11 are connected in series between the supply voltage $V_{DD}$ and ground, NMOS transistors M2 and M6 and PMOS transistor M10 are connected in series between the supply voltage $V_{DD}$ and ground, and NMOS transistors M4 and M8 and PMOS transistor M12 are connected in series between the supply voltage $V_{DD}$ and ground, all as shown. A first operational amplifier 201 is connected to receive a control voltage Vc at its non-inverting input, while its inverting input is connected to the common connection node of transistors M1 and M5. The output of the first operational amplifier 201 is connected to the gates of transistors M5 and M7. A second operational amplifier 202 is connected to receive the control voltage Vc at its non-inverting input, while its inverting input is connected to the common connection node of transistors M2 and M6. The output of the second operational amplifier 202 is connected to the gates of transistors M6 and M8. The positive side of a differential input voltage Vid is connected to the, gates of transistors M1 and M3, while the negative side of a differential input voltage Vid is connected to the gates of transistors M2 and M4. The gates of transistors M9 and M12 are connected together and to the common connection node of transistors M8 and M12. The gates of transistors M10 and M11 are connected together and to the common connection node of transistors M7 and M11. The positive side of an output current node providing current Io+ is connected to the common connection node of transistors M6 and M10. The negative side of an output current node providing current Io- is connected to the common connection node of transistors M5 and M9.

The VCT circuit of FIG. 2 is based on the circuit of FIG. 1, but is modified in accordance with the principles of the present invention to significantly increase the linearity of the transconductor by making both gm+ and gm- independent of Vid. The modification also makes the circuit truly differential by making gm+ and gm- equal for the entire input range and the entire control range. Further, the modification also significantly increases the voltage control range by making both gm+ and gm- proportional to Vc, even when the input transistors M1 and M3, or M2 and M4, enter the saturation region. Still further, the modification eliminates the need for a third operational amplifier and for a common mode extraction circuit, which saves power and integrated circuit area.

In the circuit of FIG. 2, the positive side input transconductor stage, or circuit, comprising transistors M1, M5, and M9, is provided in duplicate form. That is, corresponding transistors M3, M7, and M11, are provided, being of substantially the same construction as transistors M1, M5, and M9, respectively, with the gates of transistors M1 and M3 being connected together and to the positive side of the differential input voltage Vid, and the gates of transistors M5 and M7 being connected together and to the output of operational amplifier 201. The negative input side input transconductor stage, or circuit, comprising transistors M2, M6, and M1 , is similarly provided in duplicate form. That is, corresponding transistors M4, M8, and M12, are provided, being of substantially the same construction as transistors M2, M6, and M1 , respectively, with the gates of transistors M2 and M4 being connected together and to the negative side of the differential input voltage Vid, and the gates of transistors M6 and M8 being connected together and to, the output of operational amplifier 202. In addition, transistors M9 and M12 are connected together in a current mirror configuration, and, similarly, transistors M10 and M11 are connected together in a current mirror configuration.

In the positive side of the input stage, since transistors M1 and M5 are connected in a cascode configuration, and transistors M3 and M7 are also connected in a cascode configuration, then if transistors M5 and M7 operate in the saturation region, a condition that can be met by properly sizing transistors M9, M10, M11 and M12, the output impedance at the drains of both transistors M5 and M7 is substantially high. The consequence of this is that the drain voltages of transistors M5 and M7 have a very small effect on the values of the currents I1 and I3, respectively. Since transistors M5 and M7 are constructed to be substantially identical, and they have the same gate voltage, then the currents I1 and I3 are identical if the source voltages of transistors M5 and M7 are identical. Furthermore, since transistors M1 and M3 are constructed to be substantially identical, and they have the same Vgs, and further since they both operate in the linear mode, then the currents I1 and I3 are identical if the drain voltages of transistors M1 and M3 are identical. Now, assuming that current I3 is less than current I1, then the source voltage of transistor M7 (which is the same as the drain voltage of transistor M1) will have to be higher than the source voltage of transistor M7 (which is the same as the drain voltage of transistor M3). However, having a higher drain voltage on transistor M1 means that current I3 will be higher than current I1, which contradicts the assumption. Furthermore, assuming that current I1 is less than current I3, then the source voltage of transistor M5 (which is the same as the drain voltage of transistor M1) will have to be higher than the source voltage of transistor M7 (which is the same as the drain voltage of transistor M3). However, having a higher drain voltage on M1 means that current I3 will be higher than current I1, which, again, contradicts the assumption. Thus, the only stable condition for the circuit occurs when the currents I1 and I3 flowing in transistors M1 and M3, respectively, are substantially equal, and when the source voltages of transistors M5 and M7 (which are the same as the drain voltages of transistors M1 and M3, respectively), are also substantially identical. In other words, a virtual short circuit between the drains of transistors M1 and M3 is established. Since operational amplifier 201 sets the drain voltage of transistor M1 at Vc, the voltage at the drain of transistor M3 is also set at Vc. This guarantees that the control voltage Vc is controlling the drains of both transistors M1 and M3, and that the currents I1 and I3 are identical, without the need for an extra operational amplifier to force Vc on the drain of transistor M3.

The same considerations apply to the negative side of the input stage. Thus, since transistors M2 and M6 are connected in a cascode configuration, and transistors M4 and M8 are also connected in a cascode configuration, then if transistors M6 and M8 operate in the saturation region, a condition that can be met by properly sizing transistors M9, M10, M11 and M12, the output impedance at the drains of both transistors M6 and M8 is substantially high. The consequence of this is that the drain voltages of transistors M6 and M8 have a very small effect on the values of the currents I2 and I4, respectively. Since transistors M6 and M8 are constructed to be substantially identical, and they have the same gate voltage, then the currents I2 and I4 are identical if the source voltages of transistors M6 and M8 are identical. Furthermore, since transistors M2 and M4 are constructed to be substantially identical, and they have the same Vgs, and further since they both operate in the linear mode, then the currents I2 and I4 are identical if the drain voltages of transistors M2 and M4 are identical. Now, assuming that current I4 is less than current I2, then the source voltage of transistor M8 (which is the same as the drain voltage of transistor M4) will have to be higher than the source voltage of transistor M6 (which is the same as the drain voltage of transistor M2). However, having a higher drain voltage on transistor M4 means that current I4 will be higher than current I2, which contradicts the assumption. Furthermore, assuming that current I2 is less than current I4, then the source voltage of transistor M6 (which is the same as the drain voltage of transistor M2) will have to be higher than the source voltage of transistor M8 (which is the same as the drain voltage of transistor M4). However, having a higher drain voltage on M2 means that current I4 will be higher than current I2, which, again, contradicts the assumption. Thus, the only stable condition for the circuit occurs when the currents I2 and I4 flowing in transistors M2 and M4, respectively, are substantially equal, and when the source voltages of transistors M6 and M8 (which are the same as the drain voltages of transistors M2 and M4, respectively), are also substantially identical. In other words, a virtual short circuit between the drains of transistors M2 and M4 is established. Since operational amplifier 201 sets the drain voltage of transistor M2 at Vc, the voltage at the drain of transistor M4 is also set at Vc. This guarantees that the control voltage Vc is controlling the drains of both transistors M2 and M4, and that the currents I2 and I4 are identical, without the need for an extra operational amplifier to force Vc on the drain of transistor M4.

The following equations help to show with even more clarity how the inventive improvements to the VCT circuit of FIG. 2 improve the linearity, control voltage, and input range of the transconductor. Using Equation (9):

$$I1 = I3 = K\left[\left(\left(Vcm + \frac{Vid}{2}\right) + a\left(Vcm + \frac{Vid}{2}\right)^2 - Vt\right)Vc - \frac{Vc^2}{2}\right] \quad \text{Eq. (20)}$$

$$I2 = I4 = K\left[\left(\left(Vcm - \frac{Vid}{2}\right) + a\left(Vcm - \frac{Vid}{2}\right)^2 - Vt\right)Vc - \frac{Vc^2}{2}\right] \quad \text{Eq. (21)}$$

$$Io+ = I3-I2 = K[(1+2aVcm)VidVc] \quad \text{Eq. (22)}$$

$$Io- = I1-I4 = K[(1+2aVcm)VidVc] \quad \text{Eq. (23)}$$

$$gm+ = \frac{\partial}{\partial Vid}Io+ = K[(1+2aVcm)Vc] \quad \text{Eq. (24)}$$

$$gm- = \frac{\partial}{\partial Vid}Io- = K[(1+2aVcm)Vc] \quad \text{Eq. (25)}$$

Comparing Equations (22) through (25), it can be seen that both the positive and negative current outputs, as well at the positive and negative transconductances are equal for the VCT circuit of FIG. 2. These equalities show that the circuit is, indeed, truly fully differential, and has reduced common mode distortion as well as offsets that occur when Io+ and Io− are not equal. Further, these equations show that the transconductances of the circuit of FIG. 2 are constant with respect to the differential input, which can be contrasted the circuit of FIG. 1, as shown in Equations (15) and (16). Since the circuit of FIG. 2 has constant transconductances, the output currents Io+ and Io− are linear with respect to differential input. This significantly reduces the total harmonic distortion, as compared with prior art circuits. If a certain amount of error in the transconductances, i.e., non-linearity in the output currents, is acceptable, the circuit of FIG. 2 provides a much wider differential input range for the same amount of error than the circuit in FIG. 1.

Now, in order to understand how the improvements in the VCT circuit of FIG. 2 extend the control range as well, consider the condition where transistors M2 and M4 enter the saturation mode of operation. This means that:

$$Vc < Vcm - \frac{Vid}{2} - Vt \quad \text{Eq. (27)}$$

$$I2 = I4 = \frac{K}{2}\left[\left(Vcm - \frac{Vid}{2} - Vt\right)^2\right] \quad \text{Eq. (28)}$$

$$gm+ = \quad \text{Eq. (29)}$$
$$\frac{\partial}{\partial Vid}Io+ = \frac{K}{2}\left[Vcm - \frac{Vid}{2} - Vt\right] + K\left[\frac{1}{2} + a\left(Vcm + \frac{Vid}{2}\right)\right]Vc$$

$$gm- = \quad \text{Eq. (30)}$$
$$\frac{\partial}{\partial Vid}Io- = \frac{K}{2}\left[Vcm - \frac{Vid}{2} - Vt\right] + K\left[\frac{1}{2} + a\left(Vcm + \frac{Vid}{2}\right)\right]Vc$$

Comparing Equations (29) and (30) with Equations (18) and (19), Equations (29) and (30) shown that for high values of Vc when some of the transistors go into the saturation region, the transconductances, although dependent on Vid, still can be controlled by Vc linearly. This is very beneficial, especially at low supply voltages, e.g., 1.8 volts or lower. Equations (29) and (30) also show that both gm+ and gm− are equal, thereby maintaining the fully differential nature of the circuit, even when the transistors enter the saturation region of operation.

Thus, the present invention provides an approach to design voltage controlled transconductors with improved linearity by splitting the respective sides of the differential transconductor into two identical circuits and connecting them together such that the current of the duplicate circuit of one side is subtracted from the current of the primary circuit of the other side to produce the respective differential output currents. The improved linearity enables a high differential input range as well as a high control voltage range with a low supply voltage. The approach enables this high performance by substantially eliminating second order effects in linear mode based transconductors. The approach also eliminates the need for an extra operational amplifier and common mode extraction circuitry, which saves power and integrated circuit area without compromising the high performance. VCT circuits designed in accordance with the principles of the present invention may be used in any application calling for a VCT circuit requiring highly linear performance, for example in Gm-C filters. The voltage controlled performance also makes such circuits tolerant to process variations, e.g. RC constants.

Although the present invention and its advantages have been described in detail, it should be understood that various changes, substitutions and alterations can be made herein without departing from the spirit and scope of the invention as defined by the appended claims.

What is claimed is:

1. A voltage controlled transconductor for receiving a differential input signal comprising a first voltage signal and a second voltage signal, and for providing a differential output signal comprising a first output current signal and a second output current signal, comprising:
    a first side transconductor circuit having two parts of the same construction, the first part being capable of conducting a first current signal and the second part being capable of conducting a second current signal, the first current signal and the second current signal being controlled by the first voltage signal;
    a second side transconductor circuit having two parts of the same construction, the first part being capable of conducting a third current signal and the second part being capable of conducting a fourth current signal, the third current signal and the fourth current signal being controlled by the second voltage signal;
    a first control circuit adapted to control the first and second current signals of the first side transconductor circuit; and
    a second control circuit adapted to control the third and fourth current signals of the second side transconductor circuit;
    the first side transconductor circuit being connected to the second side transconductor circuit to provide the first output current signal comprising a difference of the second current signal and the third current signal and to provide the second output current signal comprising a difference of the first current signal and the fourth current signal.

2. A voltage controlled, differential transconductor, comprising:
    a first first-side transconductor circuit adapted to receive a first input voltage signal and to conduct a first current signal;
    a first second-side transconductor circuit adapted to receive a second input voltage signal and to conduct a second current signal;
    a second first-side differential transconductor circuit having substantially the same construction as the first first-side transconductor circuit, and adapted to receive the first input voltage signal and to conduct a third current signal;
    a second second-side transconductor circuit having substantially the same construction as the first second-side transconductor circuit, and adapted to receive the second input voltage signal and to conduct a fourth current signal;
    a first control circuit adapted to control the first and third current signals of the first first-side transconductor circuit and of the second first-side transconductor circuit; and
    a second control circuit adapted to control the second and fourth current signals of the first second-side transconductor circuit and of the second second-side transconductor circuit;
    the first first-side transconductor circuit being connected to the second second-side transconductor circuit and the first second-side transconductor circuit being connected to the second first-side transconductor circuit, such that a first output current is provided that is a difference of the third current signal and the second current signal, and a second output current is provided that is a difference of the first current signal and the fourth current signal.

3. A voltage controlled, differential transconductor, comprising:
    a first first-side transconductor circuit including a first MOSFET transistor, and adapted to receive a first input voltage signal and to conduct a first current signal;
    a first second-side transconductor circuit including a second MOSFET transistor, and adapted to receive a second input voltage signal and to conduct a second current signal;
    a second first-side differential transconductor circuit having substantially the same construction as the first first-side transconductor circuit, including a third MOSFET transistor having substantially the same construction as the first MOSFET transistor, and adapted to receive the first input voltage signal and to conduct a third current signal;
    a second second-side transconductor circuit having substantially the same construction as the first second-side transconductor circuit, including a fourth MOSFET transistor having substantially the same construction as the third MOSFET transistor, and adapted to receive the second input voltage signal and to conduct a fourth current signal;
    a first control circuit adapted to control the first and the third currents of the first side transconductor circuit; and
    a second control circuit adapted to control the second and the fourth currents of the second side transconductor circuit;
    the first first-side transconductor circuit being connected to the second second-side transconductor circuit and the first second-side transconductor circuit being connected to the second first-side transconductor circuit, such that a first output current is provided that is a difference of the third current signal and the second current signal, and a second output current is provided that is a difference of the first current signal and the fourth current signal.

4. A voltage controlled transconductor, comprising:
    a first first-side transconductor circuit comprising first, second and third MOSFET transistors connected in series between power supply nodes, the first MOSFET transistor being adapted to receive a first input voltage signal and to conduct a first current signal;
    a first second-side transconductor circuit comprising fourth, fifth and sixth MOSFET transistors connected in series between power supply nodes, the fourth MOSFET transistor being adapted to receive a second input voltage signal and to conduct a second current signal;
    a second first-side differential transconductor circuit having substantially the same construction as the first first-side transconductor circuit, and comprising seventh, eighth and ninth MOSFET transistors connected in series between power supply nodes, the seventh MOSFET transistor being adapted to receive the first input voltage signal and to conduct a third current signal;

a second second-side transconductor circuit having substantially the same construction as the first second-side transconductor circuit, and comprising tenth, eleventh and twelfth MOSFET transistors connected in series between power supply nodes, the tenth MOSFET transistor being adapted to receive the second input voltage signal and to conduct a fourth current signal;

a first control circuit connected to the second and eighth MOSFET transistors and adapted to control a gate-to-source voltage of the second and eighth MOSFET transistors, and to control the first and the third currents of the first side transconductor circuit; and a second control circuit connected to the fifth and eleventh MOSFET transistors and adapted to control a gate-to-source voltage of the fifth and eleventh MOSFET transistors, and to control the second and the fourth currents of the first side transconductor circuit;

the third MOSFET transistor being connected to the twelfth MOSFET transistor in a current mirror configuration, and the sixth MOSFET transistor being connected to the ninth MOSFET transistor in a current mirror configuration, such that a first output current is provided that is a difference of the third current signal and the second current signal, and a second output current is provided that is a difference of the first current signal and the fourth current signal.

* * * * *